(12) United States Patent
Hatano et al.

(10) Patent No.: US 9,673,214 B2
(45) Date of Patent: Jun. 6, 2017

(54) SEMICONDUCTOR DEVICE

(71) Applicant: Kabushiki Kaisha Toshiba, Minato-ku (JP)

(72) Inventors: Masaaki Hatano, Yokkaichi (JP); Osamu Matsuura, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/071,463

(22) Filed: Mar. 16, 2016

(65) Prior Publication Data

US 2017/0103995 A1    Apr. 13, 2017

Related U.S. Application Data

(60) Provisional application No. 62/238,384, filed on Oct. 7, 2015.

(51) Int. Cl.
| | |
|---|---|
| *H01L 27/115* | (2017.01) |
| *H01L 29/06* | (2006.01) |
| *H01L 23/58* | (2006.01) |
| *H01L 27/11582* | (2017.01) |
| *H01L 27/11526* | (2017.01) |
| *H01L 27/11556* | (2017.01) |

(Continued)

(52) U.S. Cl.
CPC ...... *H01L 27/11582* (2013.01); *H01L 23/528* (2013.01); *H01L 23/53266* (2013.01); *H01L 23/564* (2013.01); *H01L 23/585* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 29/0649* (2013.01)

(58) Field of Classification Search
CPC .......... H01L 27/11521; H01L 27/1159; H01L 27/11526; H01L 27/11592; H01L 27/11551; H01L 27/11597; H01L 27/11595; H01L 27/11582; H01L 29/0649
See application file for complete search history.

(56) References Cited

U.S. PATENT DOCUMENTS

| | | | |
|---|---|---|---|
| 8,115,245 B2 | 2/2012 | Yoshimizu et al. |
| 8,338,956 B2 | 12/2012 | Maeda |

(Continued)

FOREIGN PATENT DOCUMENTS

| | | |
|---|---|---|
| JP | 2010-80685 | 4/2010 |
| JP | 2011-100921 | 5/2011 |

*Primary Examiner* — Moazzam Hossain
(74) *Attorney, Agent, or Firm* — Oblon, McClelland, Maier & Neustadt, L.L.P.

(57) ABSTRACT

A semiconductor device according to embodiments described below includes an element region and a peripheral region. The element region is disposed on a substrate and semiconductor elements are collocated in the element region. The peripheral region is disposed on the substrate and surrounds the element region. The element region extends in a first direction parallel to the substrate and includes a plurality of wiring layers laminated on the substrate. The peripheral region includes a peripheral layer arranged to surround the element region. The peripheral layer includes a first part extending in the first direction and a second part extending in a second direction intersecting the first direction. The cross-section structures of the first part and the second part are different from one another.

13 Claims, 18 Drawing Sheets

(51) Int. Cl.
*H01L 27/11573* (2017.01)
*H01L 27/11521* (2017.01)
*H01L 27/11568* (2017.01)
*H01L 23/528* (2006.01)
*H01L 23/532* (2006.01)
*H01L 23/00* (2006.01)

(56) References Cited

U.S. PATENT DOCUMENTS

| | | | |
|---|---|---|---|
| 9,230,987 B2 * | 1/2016 | Pachamuthu et al. | H01L 27/11582 |
| 9,312,270 B2 * | 4/2016 | Jang et al. | H01L 21/28273 |
| 2003/0132429 A1 * | 7/2003 | Kim et al. | H01L 21/76897 257/1 |
| 2003/0134457 A1 * | 7/2003 | Kim et al. | H01L 21/768 438/132 |
| 2009/0059656 A1 * | 3/2009 | Kanakasabapathy et al. | H01L 23/544 365/158 |
| 2009/0091983 A1 * | 4/2009 | Ku et al. | H01L 27/11521 365/185.33 |
| 2010/0240205 A1 * | 9/2010 | Son et al. | H01L 27/11551 438/588 |
| 2011/0108907 A1 * | 5/2011 | Maeda | H01L 27/11573 257/324 |
| 2012/0129301 A1 * | 5/2012 | Or-Bach et al. | G11C 8/16 438/129 |
| 2013/0037968 A1 * | 2/2013 | Ishida | H01L 23/544 257/797 |
| 2013/0320341 A1 * | 12/2013 | Leedy | H01L 21/76898 257/48 |
| 2014/0065430 A1 * | 3/2014 | Yamazaki et al. | H01L 27/1214 428/426 |
| 2015/0236038 A1 * | 8/2015 | Pachamuthu et al. | H01L 27/11582 257/326 |
| 2016/0056230 A1 * | 2/2016 | Lin et al. | H01L 21/76 257/491 |
| 2016/0071872 A1 * | 3/2016 | Saito et al. | H01L 27/11582 257/314 |
| 2016/0260732 A1 * | 9/2016 | Lue | H01L 27/11582 257/314 |
| 2016/0268264 A1 * | 9/2016 | Hwang et al. | H01L 27/11578 |

* cited by examiner

SEMICONDUCTOR DEVICE

CROSS REFERENCE TO RELATED APPLICATIONS

This application is based on and claims the benefit of priority from prior U.S. prior provisional Patent Application No. 62/238,384, filed on Oct. 7, 2015, the entire contents of which are incorporated herein by reference.

FIELD

Embodiments described herein relate generally to a semiconductor device.

BACKGROUND

Recently, attention has been focused on a laminated-type (three-dimensional) semiconductor memory device as a device that can achieve high integration without being restricted by the limit of resolution of the lithography technology. In such three-dimensional semiconductor memory device, the memory cells are disposed in a laminating direction. Conducting layers extend from the respective memory cells, which are disposed in the laminating direction.

This three-dimensional semiconductor memory device has a problem that as increasing the thickness of the laminating direction, the stress generated by the laminate material increases the warping of the laminated structure.

DETAILED DESCRIPTION

A semiconductor device according to embodiments described below includes an element region and a peripheral region. The element region is disposed on a substrate, and semiconductor elements are collocated in the element region. The peripheral region is disposed on the substrate and surrounds the element region. The element region extends in a first direction parallel to the substrate and includes a plurality of wiring layers laminated on the substrate. The peripheral region includes a peripheral layer arranged to surround the element region. The peripheral layer includes a first part extending in the first direction and a second part extending in a second direction intersecting the first direction. The first part and the second part have mutually different cross-section structures.

The following describes non-volatile semiconductor memory devices according to embodiments in detail with reference to the accompanying drawings. Here, these embodiments are only examples, and are not described for the purpose of limiting the present invention. The respective drawings of the non-volatile semiconductor memory devices used in the following embodiments are schematically illustrated. The thickness, the width, the ratio, and similar parameter of the layer are different from actual parameters.

The following embodiments relate to a non-volatile semiconductor memory device in a structure where a plurality of metal-oxide-nitride-oxide-semiconductor (MONOS) type memory cells (memory transistors) are disposed in a height direction. The MONOS type memory cell includes: a semiconductor layer disposed in a columnar shape vertical to the substrate as a channel, and a gate electrode layer disposed on the side surface of the semiconductor layer via an electric charge accumulating layer. However, this is not also intended to limit the present invention. The present invention is applicable to electric charge accumulating layers in other format, for example, a semiconductor-oxide-nitride-oxide-semiconductor (SONGS) type memory cell or a floating-gate type memory cell.

First Embodiment

First, with reference to FIG. 1 to FIG. 17, the following describes a semiconductor memory device according to the first embodiment.

Figure 1:
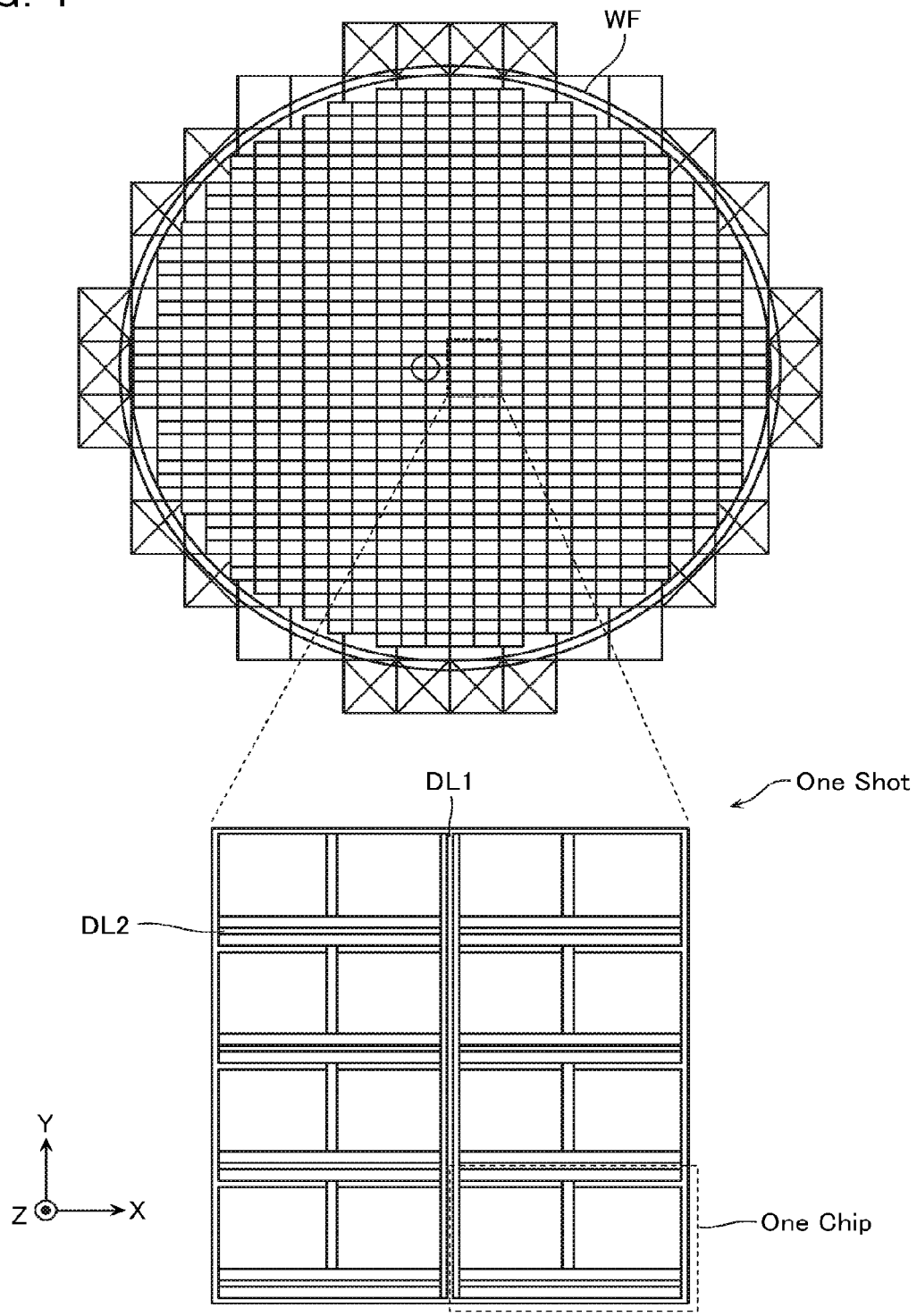
FIG. 1 is a conceptual diagram illustrating a wafer WF that includes a non-volatile semiconductor memory device according to a first embodiment and illustrating a relation between the wafer WF and a memory chip that is included in one shot.

FIG. 1 illustrates the relation among a wafer WF on which the semiconductor memory device according to the first embodiment is formed, one shot by an exposure apparatus (not illustrated), and memory chips included in one shot.

The semiconductor memory device of the first embodiment is formed on one wafer WF by what is called a step and repeat method using the exposure apparatus to project multiple shots. Further, one shot includes a plurality of memory chips. The memory chips formed on the wafer WF are diced along dicing lines DL1 and DL2.

Figure 2:
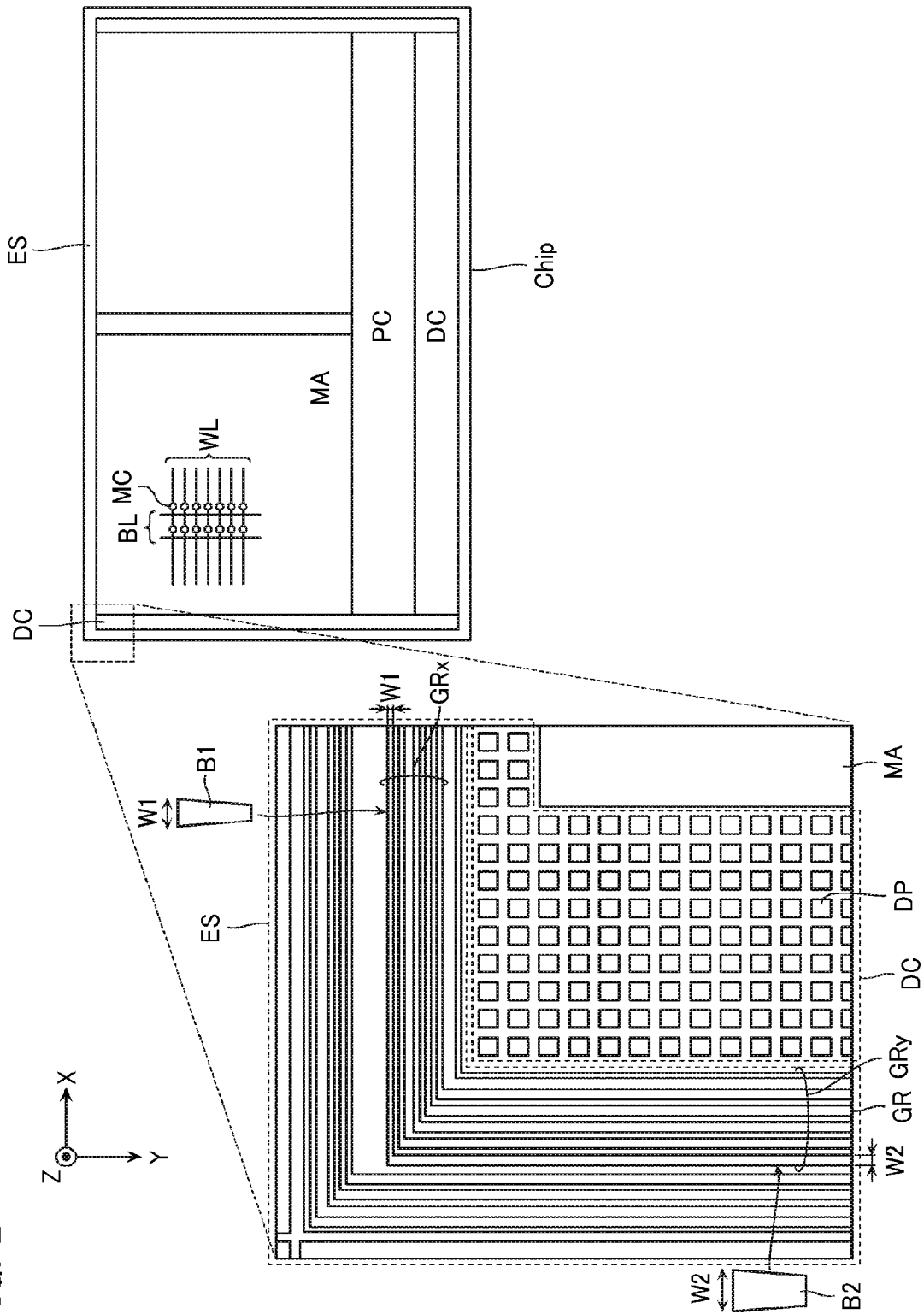
FIG. 2 is a plan view illustrating the structure of the non-volatile semiconductor memory device of the first embodiment.

FIG. 2 is a plan view illustrating the structure of one memory chip of the embodiment. The memory chip (Chip) includes a memory cell area MA, a peripheral circuit area PC, a dummy region DC, and an edge seal portion ES. The memory cell area MA is an area (element region) that includes memory cell arrays in which multiple memory cells are arranged. The memory cell array includes word lines WL and bit lines BL and similar element. Further, the intersection portions of the word lines WL and the bit lines BL include multiple memory cells MC. The peripheral circuit area PC is an area that includes circuit elements, which constitute various circuits for controlling the memory cell arrays. The dummy region DC is an area that includes components that do not function as the circuit elements. The edge seal portion ES is a peripheral region that surrounds the memory cell area MA, the peripheral circuit area PC, and the dummy region DC. The edge seal portion ES is an area that includes a guard ring GR (described later). The edge seal portion ES may be an area that includes an end surface cut along the above-described dicing lines DL1 and DL2, or may be an area separated from the dicing lines DL1 and DL2.

The left side of FIG. 2 is an enlarged view of one corner portion of the memory chip (Chip). The edge seal portion ES includes multiple guard rings GR (peripheral layers). This guard ring GR is disposed with the longitudinal direction in a laminating direction perpendicular to the substrate. The guard ring GR is arranged to surround the element region to prevent water or similar substance from invading from outside the memory chip to the direction of the memory cell array. As described later, the guard ring GR of the embodiment has a role as a moisture absorption prevention line for preventing water invasion, as well as a function for reducing the warping of the substrate. The number of the guard ring GR in one edge seal portion ES is not limited to a specific number.

One guard ring GR has a width W1 in a Y direction in a part (first part GRx) extending in an X direction of FIG. 2, and has a cross-sectional area B1 in a Y-Z cross section therein. On the other hand, the guard ring GR has a width W2, which is greater than the width W1 in the first part in the X direction, in a part (second part GRy) extending in the Y direction of FIG. 2, and has a cross-sectional area B2, which is greater than the cross-sectional area B1 in the first part GRx, in a X-Z cross section. Thus, the plurality of guard rings GR of the first embodiment have different cross-section structures between the first part GRx and the second part GRy. The total cross-sectional area is configured such that the second part GRy is greater than the first part GRx. When the plurality of guard rings GR exist in one memory chip, not all the guard rings GR are necessary to be configured as described above. For example, some guard rings GR among the plurality of guard rings GR may have the identical width over the entire peripheral area. It is only necessary that the second part GRy has a greater width than a width of the first part GRx as the entire (sum of) the plurality of guard rings GR.

The edge seal portion ES employs the above-described structure because of the following reason. In the memory cell array, the plural layers of the word lines WL are laminated in the laminating direction (Z direction) across interlayer insulating films between the word lines WL, and extends with the longitudinal direction in the X direction. When the word lines WL are composed of metallic material such as tungsten, the internal stress possibly generates warping on the substrate. The above-described structure of the guard ring GR functions to reduce the warping of the substrate. A description will be given of the reducing the warping of the substrate later in detail.

As illustrated in the left side of FIG. 2, the dummy region DC includes multiple dummy patterns DP. The dummy pattern DP is a conducting layer that does not function as a wiring. The dummy pattern DP is disposed to execute a CMP method for the balance of the stress on the chip and the chip flattening easily.

Figure 3:
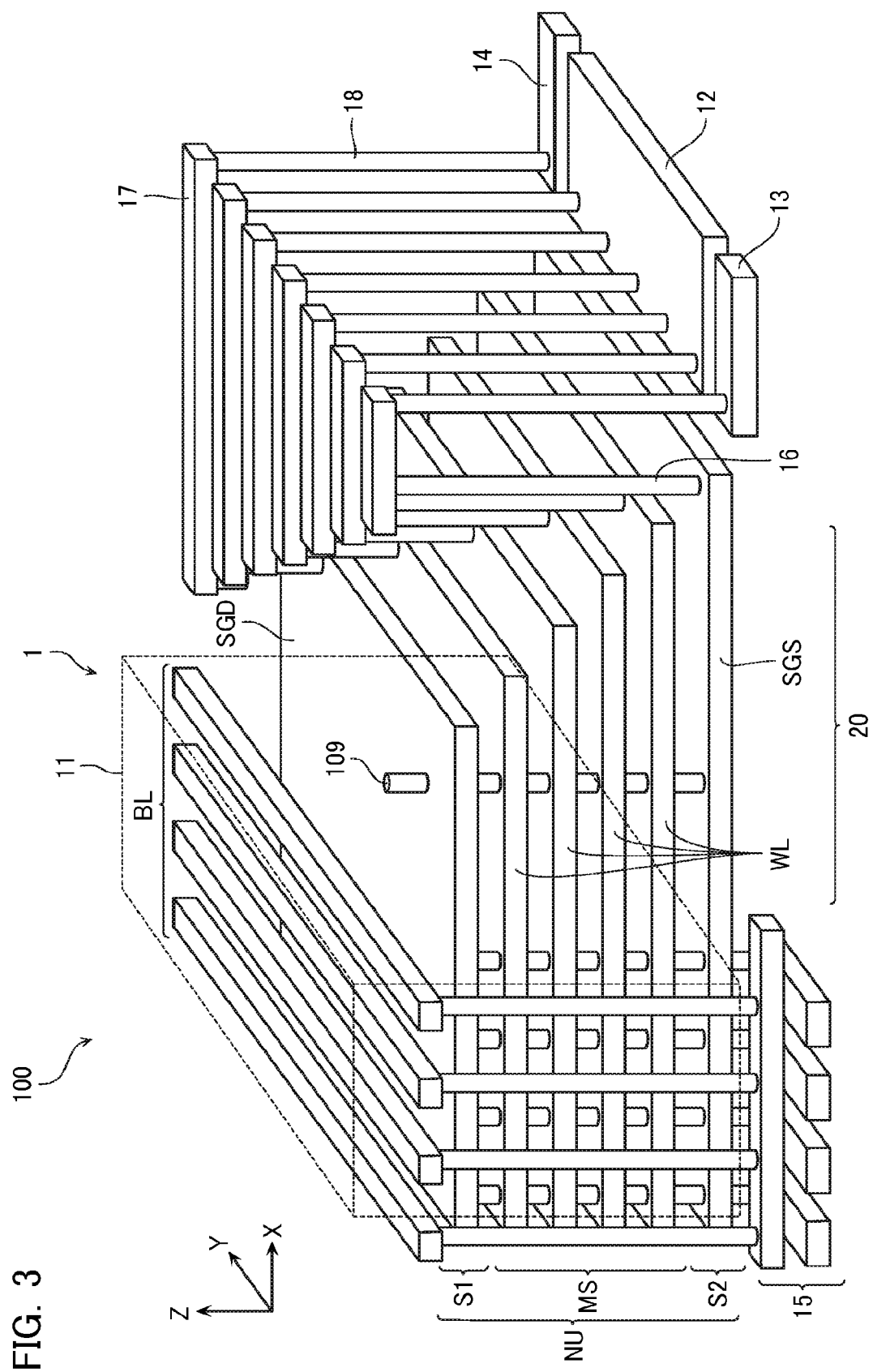
FIG. 3 is a perspective view schematically illustrating one example of the structure of the non-volatile semiconductor memory device of the first embodiment.

With reference to FIG. 3, a description will be given of the structure of a memory cell array region 11 included in the memory cell area MA. The following description is based on an orthogonal coordinate system where directions along the semiconductor substrate are the X direction and the Y direction, and a direction perpendicular to the principal plane of the semiconductor substrate is the Z direction.

A non-volatile semiconductor memory device 100 of the embodiment includes the memory cell array region 11 in the memory cell area MA. And the non-volatile semiconductor memory device 100 of the embodiment includes a word line driving circuit region 12, a source-side selection gate line driving circuit region 13, a drain-side selection gate line driving circuit region 14, and a sense amplifier region 15 in the peripheral circuit area PC.

The memory cell array region 11 includes memory strings MS, drain-side selection transistors S1, and source-side selection transistors S2 on a semiconductor substrate (not illustrated in FIG. 3). The memory string MS is constituted such that a plurality of memory cells MC (memory transistors) are connected together in series. The drain-side selection transistor S1 and source-side selection transistor S2 are connected to both respective ends of the memory string MS. Here, the memory string MS, and the drain-side selection transistor S1 and the source-side selection transistor S2 connected to both ends of the memory string MS are hereinafter referred to as a "NAND cell unit NU."

Figure 4:
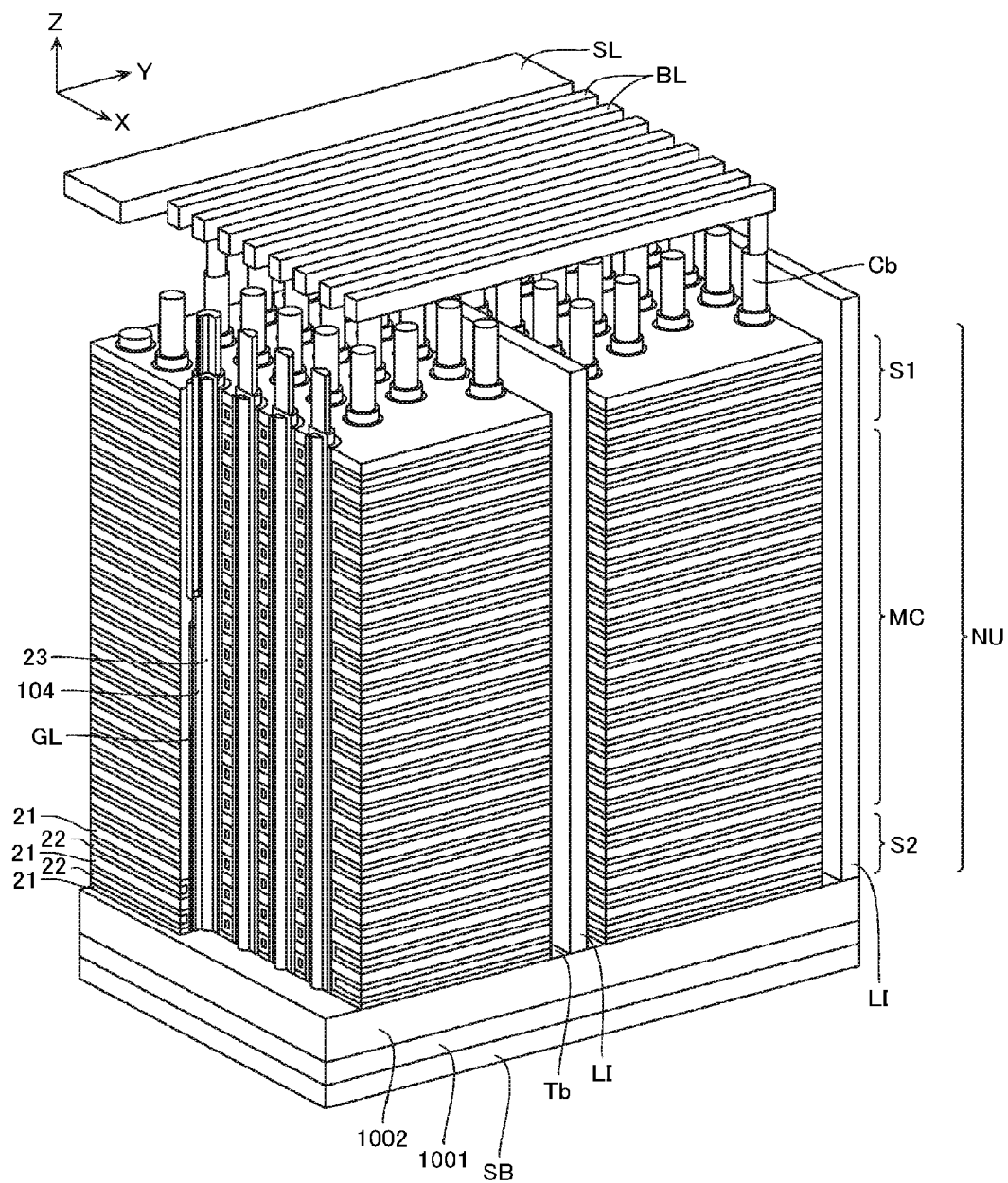
FIG. 4 is a perspective view illustrating the structure of a part of a memory cell array region 11.

As described later, the memory cell MC has the structure, where a control gate electrode (word line) is disposed, on the side surface of a columnar semiconductor film as a channel, via a memory layer including an electric charge accumulating layer. The drain-side selection transistor S1 and the source-side selection transistor S2 each have the structure where a selection gate electrode (selection gate line) is disposed on the side surface of a columnar semiconductor film via the gate insulating film. For simplification of the illustration, FIG. 3 illustrates only four memory cells MC in one memory string MS. Obviously, the number of the memory cells MC in one memory string MS may be more than four. (As described below, FIG. 4 illustrates an example where much more memory cells are included.)

The word line WL is connected in common to the adjacent memory cells on the X-Y plane. Similarly, a source-side selection gate line SGS is connected in common to the adjacent source-side selection transistors S2 on the X-Y plane. Similarly, a drain-side selection gate line SGD is connected in common to the adjacent drain-side selection transistor S1 on the X-Y plane.

Here, in the following description, the source-side selection gate line SGS and the drain-side selection gate line SGD are collectively referred to simply as "selection gate lines" in some cases. The source-side selection transistor and the drain-side selection transistor are collectively referred to simply as "selection transistors" in some cases.

Additionally, in the memory cells MC in the memory string MS, one or a plurality of the memory cells MC close to the source-side selection gate line SGS and the drain-side selection gate line SGD might be treated as a dummy cell that is not used for data storage. Two or more dummy cells may be disposed or the dummy cell may be omitted. A plurality of the drain-side selection transistor S1 and/or the source-side selection transistor S2 can be connected to one memory string MS.

Furthermore, the bit lines BL are disposed to extend having the longitudinal direction in the Y direction intersecting with the X direction, and are collocated at a predetermined pitch in the X direction. The bit line BL is connected to a plurality of the memory strings MS via the drain-side selection transistors S1. Source lines SL, which are omitted in FIG. 3, are disposed similarly having the longitudinal direction in the Y direction and connected to the memory strings MS via the source-side selection transistors S2.

The word line driving circuit region 12 is a circuit that controls the voltage to be applied to the word line WL. The source-side selection gate line driving circuit region 13 is a circuit that controls the voltage to be applied to the source-side selection gate line SGS. Further, the drain-side selection gate line driving circuit region 14 is a circuit that controls the voltage to be applied to the drain-side selection gate line SGD. The sense amplifier region 15 is a circuit for amplifying a signal (voltage) read out from a selected memory cell to the bit line BL.

A wiring portion 20 is a wiring portion for connecting the word lines WL and the selection gate lines SGD and SGS to the contacts. The word lines WL, the selection gate lines SGS and SGD have a structure processed in a staircase pattern such that the respective upper portions can independently be connected to the contacts. On the surface of respective steps in the stepped portion, contact plugs 16 are disposed extending in the Z direction. Further, to the upper end of the contact plugs 16, upper layer wirings 17 are connected. Further, from the inferior surface of the respective upper layer wirings 17, contact plugs 18 extend downward. Each contact plug 18 is connected to any of the driving circuit regions 12 to 14.

Figure 5:
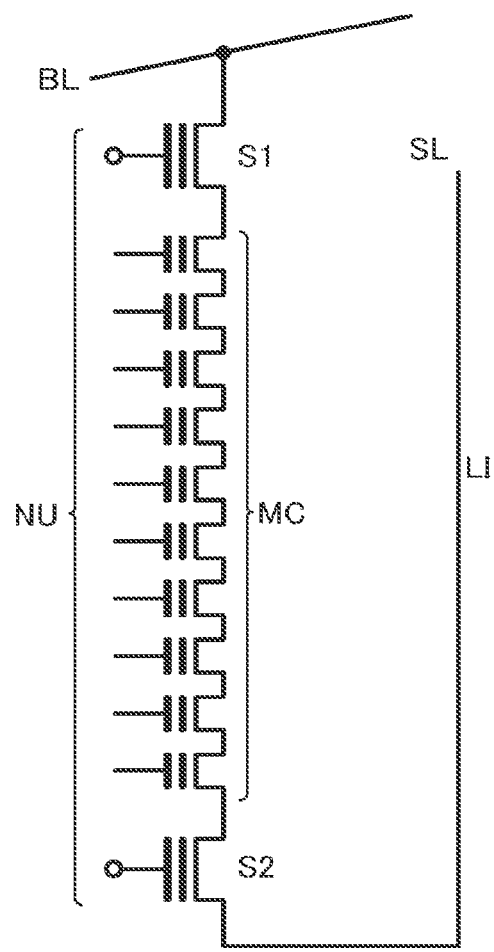
FIG. 5 is an equivalent circuit diagram of one NAND cell unit NU.
Figure 6:
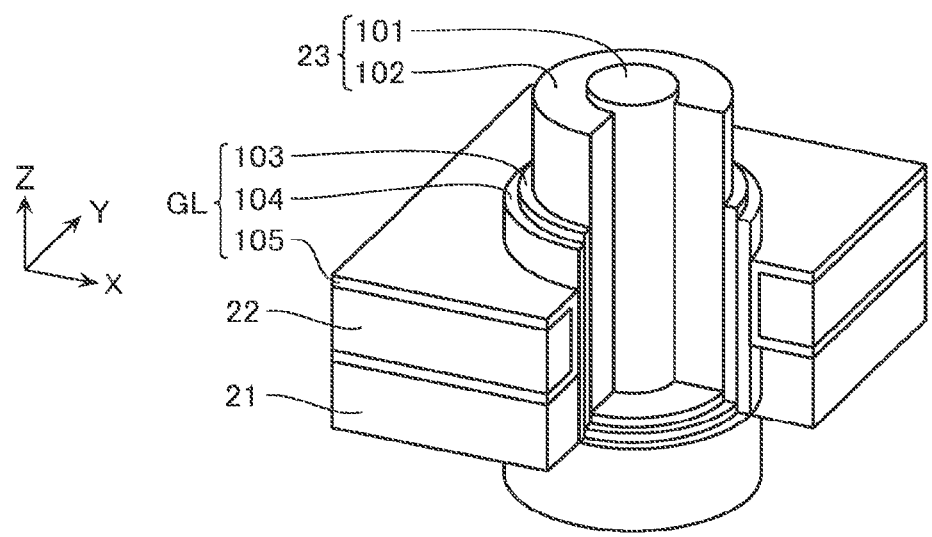
FIG. 6 is a cross-sectional perspective view of one memory cell MC.

Next, with reference to FIG. 4 to FIG. 6, a description will be given of the structure of the memory cell array region 11 in detail. FIG. 4 is a perspective view illustrating the structure of a part of the memory cell array region 11. FIG. 5 is an equivalent circuit diagram of one NAND cell unit NU. FIG. 6 is a cross-sectional perspective view of one memory cell MC and similar part.

As illustrated in FIG. 4, the memory cell array region 11 has a structure where interlayer insulating films 21 and conducting layers 22 are laminated in alternation on a semiconductor substrate SB consisting of single-crystal silicon. In the illustration example, an N type well 1001 is disposed on the substrate SB. Further, on the upper layer of the N type well 1001, a P type well 1002 is disposed. The laminated structure of the interlayer insulating films 21 and the conducting layers 22 is disposed on the upper side of the P type well 1002.

The conducting layers 22 function as a control gate (word line WL) of the memory cell MC, the source-side selection gate line SGS, or the drain-side selection gate line SGD. The interlayer insulating films 21 are disposed in the up-and-down direction of these conducting layers 22 and electrically insulate the conducting layers 22 from one another.

The conducting layers 22 can be formed of, for example, tungsten (W), tungsten nitride (WN), tungsten silicide (WSi$_x$), tantalum (Ta), tantalum nitride (TaN), tantalum silicide (TaSi$_x$), palladium silicide (PdSi$_x$), erbium silicide (ErSi$_x$), yttrium silicide (YSi$_x$), platinum silicide (PtSi$_x$), hafnium silicide (HfSi$_x$), nickel silicide (NiSi$_x$), cobalt silicide (CoSi$_x$), titanium silicide (TiSi$_x$), vanadium silicide (VSi$_x$), chromium silicide (CrSi$_x$), manganese silicide (MnSi$_x$), iron silicide (FeSi$_x$), ruthenium (Ru), molybdenum (Mo), titanium (Ti), titanium nitride (TiN), vanadium (V), chrome (Cr), manganese (Mn), iron (Fe), cobalt (Co), nickel (Ni), gold (Au), silver (Ag) or copper (Cu), or can be formed of a compound of these materials. The conducting layers 22 may be formed of polysilicon with the addition of impurities.

As illustrated in FIG. 4, to pass through this laminated body of the interlayer insulating film 21 and the conducting layers 22, semiconductor layers 23 having the longitudinal direction in the laminating direction (Z direction in FIG. 4) are disposed at a predetermined pitch in the X-Y plane. The semiconductor layers 23 function as the channel regions (body) of the memory cell MC and the selection transistors S1 and S2 that are included in the NAND cell unit NU. Between the semiconductor layer 23 and the laminated body of the conducting layers 22 and the interlayer insulating film 21, a memory layer GL including an electric charge accumulating layer is formed. The semiconductor layer 23 opposes the interlayer insulating film 21 and the conducting layers 22 via the memory layer GL. The memory layer GL may be configured of a laminated structure of electric charge accumulating layers such as silicon nitride films and oxide films such as silicon oxide films. Depending on the accumulation amount of the electric charge to this electric charge accumulating layer, the threshold voltage of the memory cell MC changes. The memory cell MC holds data corresponding to this threshold voltage.

These semiconductor layers 23 are connected, on their upper ends, to the bit lines BL via contacts Cb. The bit lines BL having the longitudinal direction in the Y direction are collocated at a predetermined pitch along the X direction.

The lower end of the semiconductor layer 23 is electrically connected to the semiconductor substrate SB. The lower end of the semiconductor layer 23 is connected to the source line SL via the semiconductor substrate SB, a source contact LI, which is described later, and the contact, which is disposed on the source contact LI (not illustrated). The source lines SL are collocated while having their longitudinal directions in the Y direction, similar to the bit lines BL.

Here, the laminated body of the interlayer insulating films 21 and the conducting layers 22 in the memory cell array region 11 is separated into blocks as the smallest unit of data erasure. At the boundary of the separation, a trench Tb is formed. In this trench Tb, an interlayer insulating film (not illustrated) is embedded. Further, the source contact LI described above is formed passing through the interlayer insulating film. This source contact LI has a lower end connected to the semiconductor substrate SB while having an upper end connected to the source line SL.

FIG. 5 is an equivalent circuit diagram of one NAND cell unit NU. One NAND cell unit includes the memory string MS constituted of a series-connected circuit of a plurality of the memory cells MC, the drain-side selection transistor S1 connected between the upper end of the memory string MS and the bit line BL, and the source-side selection transistor S2 connected between the lower end of the memory string MS and the source line SL.

FIG. 6 illustrates one example of a specific structure of one of the memory cell MC. The semiconductor layer 23 includes an insulating film core 101 and a semiconductor portion in a columnar manner (semiconductor columnar portion) 102 that surrounds the peripheral area of the insulating film core 101. The insulating film core 101 is formed of, for example, a silicon oxide film (SiO$_2$). The semiconductor columnar portion 102 is formed of, for example, polysilicon. However, instead of polysilicon, the semiconductor columnar portion 102 can be formed of, for example, single-crystal silicon (Si), silicon-germanium (SiGe), silicon carbide (SiC), germanium (Ge), or carbon (C). The semiconductor columnar portion 102 may be formed as a single layer structure of any of the above-described material, or may be formed as a laminated structure of different two or more kinds of materials. When the laminate number of the conducting layer increases and the laminated body has larger height, considering the embedding characteristics, it is preferable to employ polysilicon.

In the peripheral area of this semiconductor columnar portion 102, a tunnel insulating layer 103, a memory layer 104 (electric charge accumulating layer), and a block insulating layer 105 are formed to surround the semiconductor columnar portion 102 and constitutes the memory layer GL. The tunnel insulating layer 103 is constituted of, for example, a silicon oxide film ($SiO_x$), and functions as the tunnel insulating layer of the memory cell MC. The memory layer 104 includes, for example, a silicon nitride film (SiN), and has a function that traps (accumulates) electrons injected from the semiconductor columnar portion 102 via the tunnel insulating layer 103 by a writing operation. The block insulating layer 105 can be formed of, for example, a silicon oxide film. In this example, the block insulating layer 105 is formed to surround the peripheral area of the conducting layer 22 unlike the tunnel insulating layer 103 and the memory layer 104.

The tunnel insulating layer 103, the memory layer 104, and the block insulating layer 105 described above are collectively referred to as the memory layer GL. In the case of FIG. 6, the memory layer GL is expressed by three layers. The memory layer GL can employ various combinations with different count, order, materials, or similar parameter of the layers, but includes at least the memory layer 104 described above.

Here, the materials of the tunnel insulating layer 103 and the block insulating layer 105 can employ, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO other than the silicon oxide film ($SiO_x$).

Figure 7:
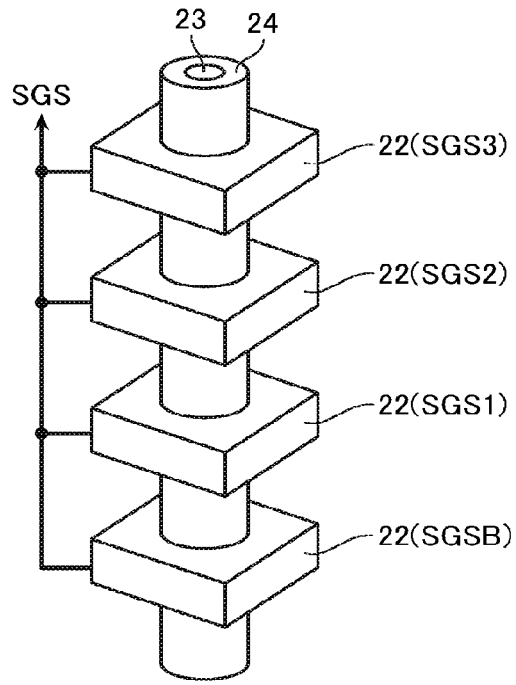
FIG. 7 is a schematic diagram illustrating one source-side selection transistor S2.

FIG. 7 illustrates the structure of the source-side selection transistor S2. As illustrated in FIG. 7, the source-side selection transistor S2 includes single source-side selection gate line SGS (gate electrode) that is constituted by short-circuiting a plurality of the conducting layers 22 (from the top of them, referred to as the conducting layer SGS3, SGS2, SGS1, and SGSB). Thus, the gate electrode is constituted of the plurality of conducting layers 22. This is preferable from the aspect of the selection characteristics improvement of the source-side selection transistor S2 (increasing ON current in ON operation and reducing leak current in OFF operation). The drain-side selection transistor S1 has an approximately similar structure to the source-side selection transistor S2. Accordingly, the following omits the description of the drain-side selection transistor S1.

Figure 8:
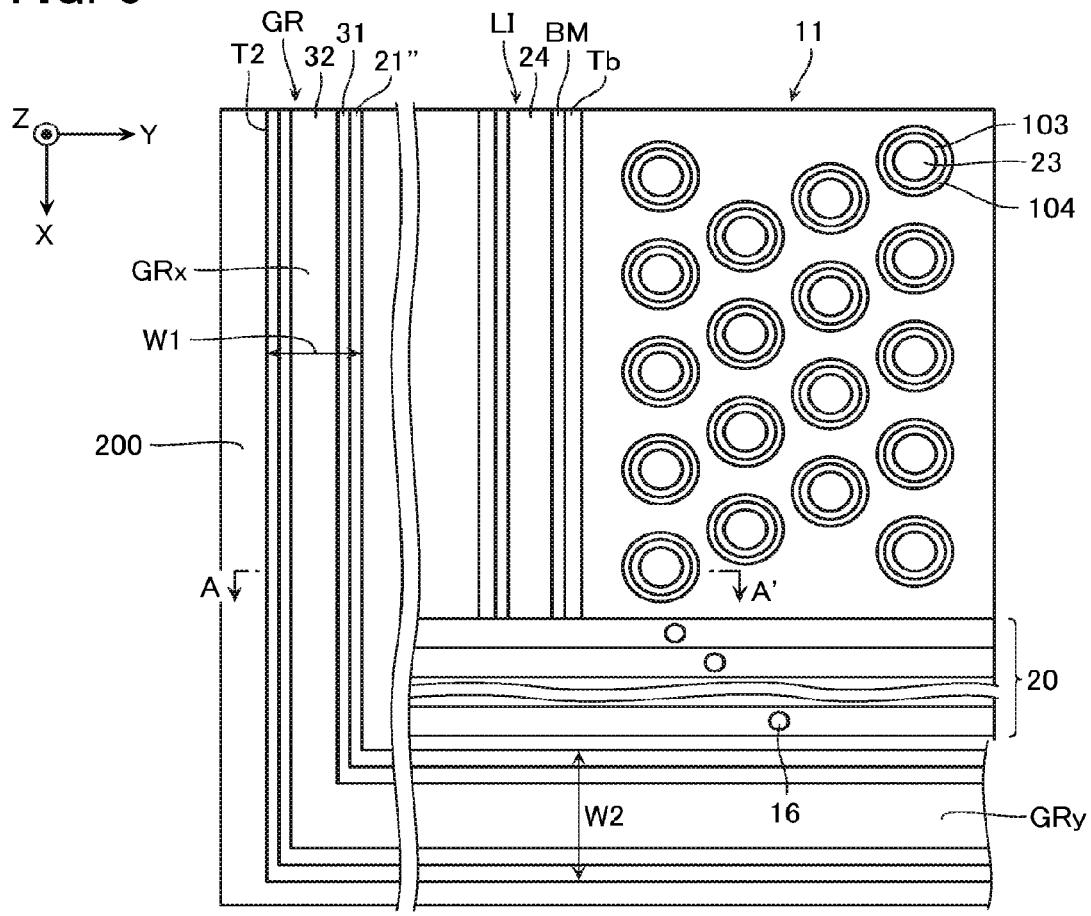
FIG. 8 is a schematic plan view illustrating a part of the memory cell array region 11 (including a stepped portion 20) and a part of an edge seal portion ES of the first embodiment.
Figure 9:
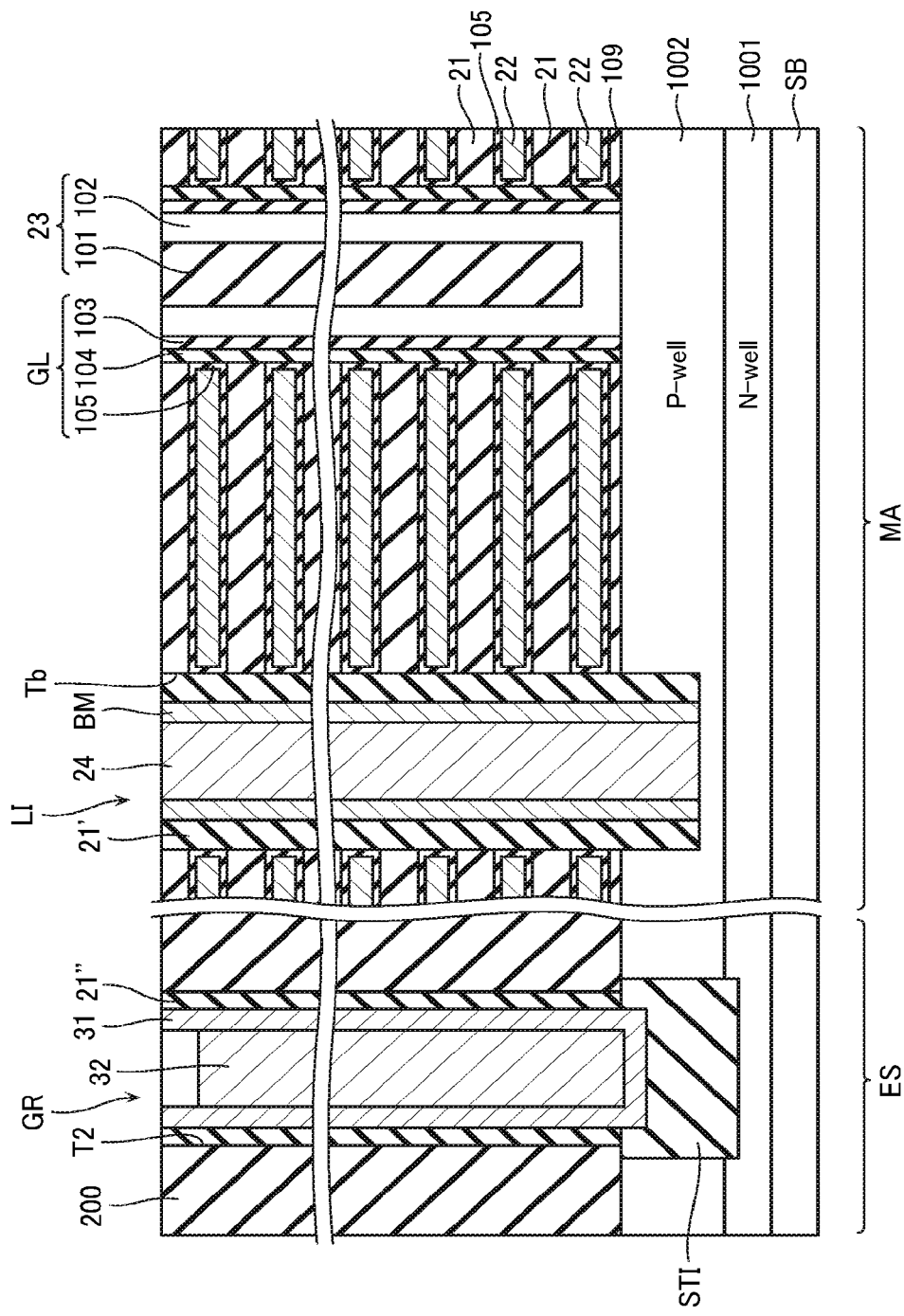
FIG. 9 is a cross-sectional view schematically illustrating in the X-X' direction in FIG. 8.

Next, with reference to FIG. 8 and FIG. 9, a description will be given of the structure of the memory cell array region 11 and the edge seal portion ES. FIG. 8 is a schematic plan view illustrating a part of the memory cell array region 11 (including the stepped portion 20) and a part of the edge seal portion ES. FIG. 9 is a cross-sectional view schematically illustrating in the X-X' direction in FIG. 8.

As illustrated in FIG. 8 and FIG. 9, the semiconductor layers 23 are collocated having the longitudinal direction in the Z direction to pass through the multiple conducting layers 22 laminated in the Z direction. The semiconductor layers 23 are arrayed in one row in the oblique direction with respect to the X direction (the word line direction) and the Y direction (the bit-line direction). This increases the array density of the semiconductor layer 23 in the memory cell array region 11, thus increasing the array density of the memory cell MC. However, this is only one example, and the semiconductor layers 23 can be disposed along the X direction and the Y direction.

Figure 10:
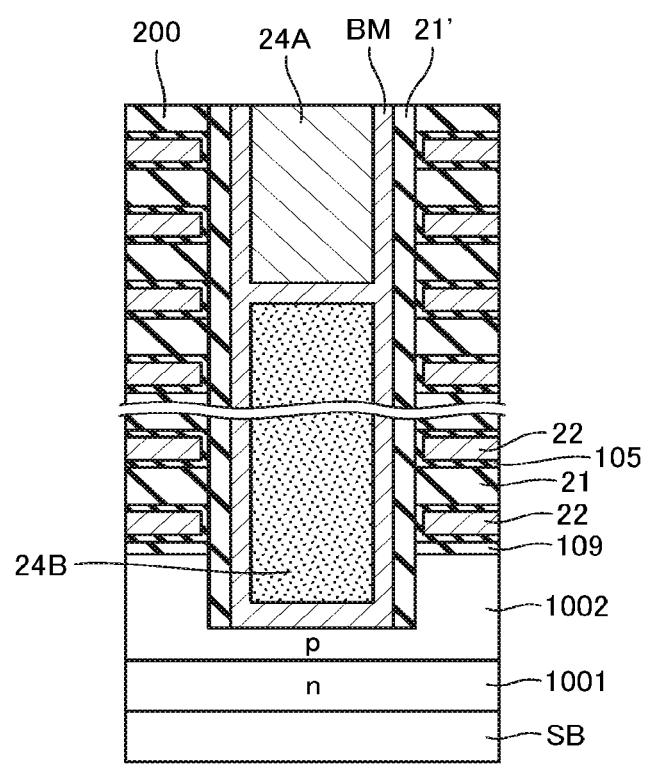
FIG. 10 illustrates another exemplary configuration of a source contact L1.

The source contact LI is formed, for example, in a stripe shape to have the longitudinal direction in the X direction, and is formed by embedding a barrier metal film BM and a metal film 24 in the trench Tb via an interlayer insulating film 21'. The stripe shape is only an example. Insofar as the source contact LI can connect the substrate SB to the source line SL, the source contact LI can be employed in various shapes. The barrier metal film BM can be constituted of, for example, titanium nitride (TiN), tungsten nitride (WN), tantalum nitride (TaN), or the laminated film of these materials. The metal film 24 may be constituted of the identical material to the conducting layer 22, or other material. The metal film 24 that constitutes the source contact LI is not necessary to employ single material. As illustrated in FIG. 10, the metal film 24 may employ the laminated structure of a first conducting film 24A and a second conducting film 24B. As one example, tungsten is applicable to the first conducting film 24A and polysilicon is applicable to the second conducting film 24B.

The edge seal portion ES is formed to surround the peripheral area of the memory cell array region 11 with the above-described structure. The edge seal portion ES includes multiple guard rings GR as described above. In FIG. 8 and FIG. 9, only one guard ring GR is illustrated representatively.

The guard ring GR includes an interlayer insulating film 21", a barrier metal film 31, and a conducting layer 32, which are embedded in a trench T2. An isolation insulating film STI is in contact with the lower end of the guard ring GR to isolate the guard ring GR from the substrate SB. The isolation insulating film STI is formed by embedding insulating material such as the silicon oxide film into an isolation insulating groove, which is formed by digging down the substrate SB.

The barrier metal film 31 is constituted of, for example, titanium nitride, tungsten nitride, tantalum nitride, or the laminated structure of these materials. The material of the barrier metal film 31 may be identical to the material of the barrier metal film BM, or other material. The conducting layer 32 may be constituted of the identical material to the conducting layer 22 and the metal film 24, or other material. As the component of the guard ring GR, instead of the conducting layer 32, for example, the insulating material such as silicon nitride (SiN) can be employed.

As illustrated in FIG. 8, this guard ring GR has the first part GRx, which extends in the X direction, and the second part GRy, which extends in the Y direction. The width W2 of the second part GRy in the X direction is configured to be larger than the width W1 of the first part GRx in the Y direction.

Figure 21:
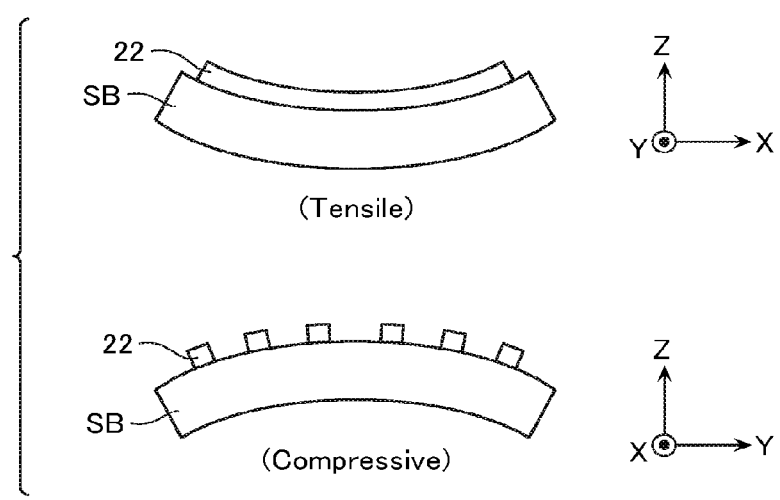
FIG. 21 is a conceptual diagram describing a problem of a semiconductor memory device with a laminated structure.

The semiconductor memory device of the embodiment is formed such that the conducting layer 22 constituting the word line WL has the longitudinal direction in the X direction. When the conducting layer 22 is formed of, for example, tungsten as the material, the internal stress possibly generates warping on the substrate SB. A specific description will be given of this with reference to FIG. 21. In the X direction as the longitudinal direction of the conducting layer 22, the tensile stress of tungsten easily occurs the U-shaped (tensile) warping on the substrate SB.

On the other hand, in the Y direction, the warping to the convex (compressive) direction easily occurs on the substrate SB inverse to the case of the X direction. Thus, in the case where the semiconductor memory device has the conducting layer 22 formed in multiple layers as described above, the substrate SB has the warping in the different directions, the X direction and the Y direction. The warping on the substrate SB possibly causes the deviation of the positioning in the subsequent various manufacturing processes (photolithography, etching, and similar process). In addition, when the wafer is conveyed, the warping on the substrate possibly causes the difficulty in the chucking and conveyance of the wafer.

Therefore, according to the embodiment, the structure of the edge seal portion ES reduces the warping. As described above, with the conducting layer 22 having the longitudinal direction in the X direction, in the guard ring GR in the edge seal portion ES, the width W2 of the second part GRy, which is along the Y direction perpendicular to the X direction, is configured to be larger than the width W1 of the first part GRx. This causes the Y directional internal stress of the second part of the guard ring GR to act as the counter of the X directional internal stress of the conducting layer 22. This ensures to reduce the difference of the warping on the substrate SB between the X direction and the Y direction.

Next, with reference to FIG. 11 to FIG. 17, a description will be given of the manufacturing method for the semiconductor memory device of the first embodiment.

Figure 11:
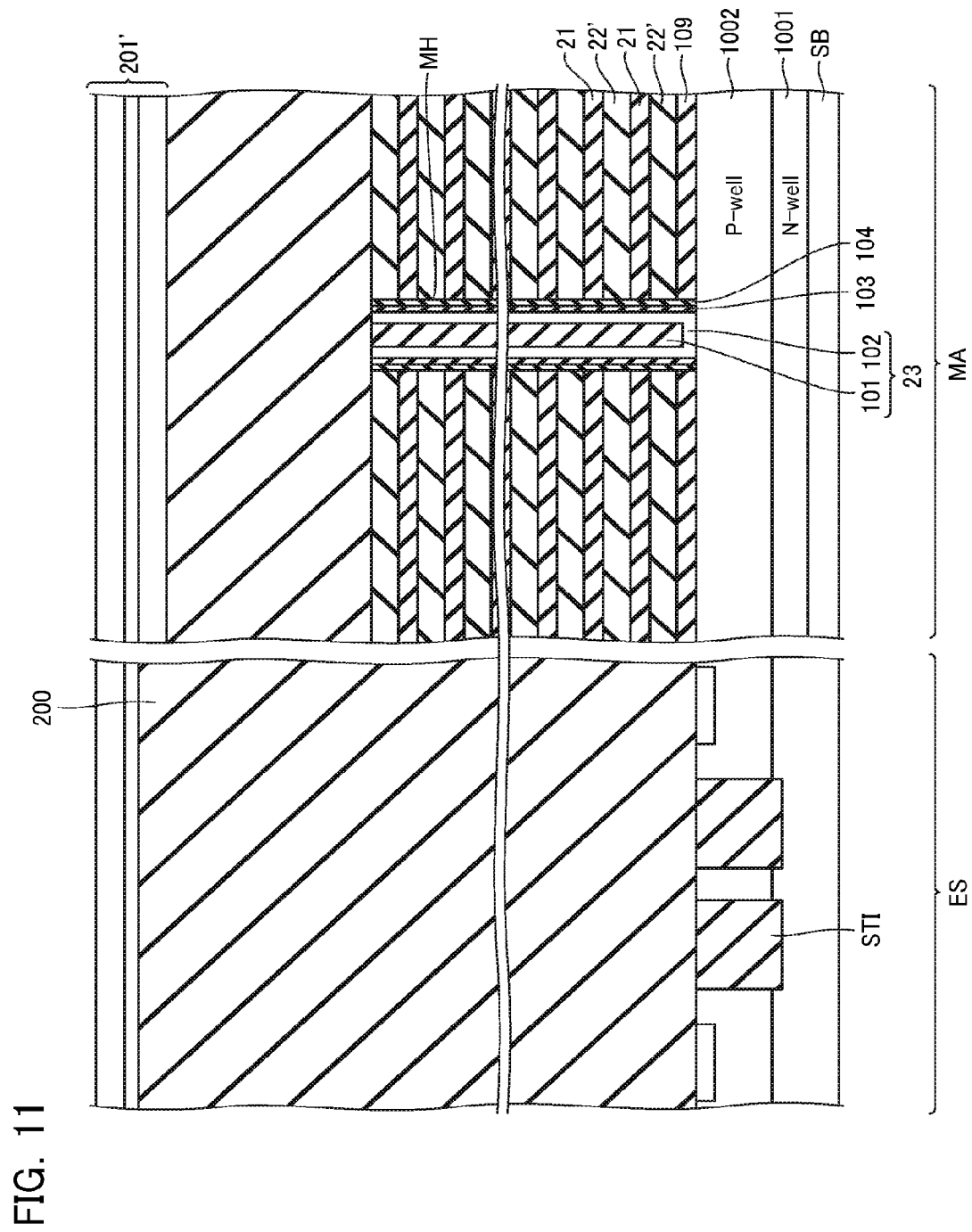
FIG. 11 to FIG. 17 are process diagrams describing the manufacturing process of the non-volatile semiconductor memory device of the first embodiment.

First, as illustrated in FIG. 11, on the substrate SB where the N type well 1001 and the P type well 1002 are formed, a gate insulating film 109 constituted of the silicon oxide film or similar film is formed. Further, on the upper side of the gate insulating film 109, a sacrificial film 22' constituted of the silicon nitride film and the interlayer insulating film 21 constituted of, for example, the silicon oxide film are laminated in alternation to form the laminated body. Then, a memory hole MH that passes through the laminated body and the gate insulating film 109 is formed by an anisotropic etching such as RIE. The RIE is continued until the bottom face of this memory hole MH passes through the gate insulating film 109 to reach below the surface of the substrate SB.

Then, on the inner wall of the memory hole MH, the above-described memory layer 104 and tunnel insulating layer 103 are deposited by CVD method or similar method to form a part of the memory layer GL. In this respect, to avoid the tunnel insulating layer 103 damaged by the RIE described later, a cover film can be formed additionally. As an example of the material of the cover film, polysilicon is applicable. In this case, the polysilicon of the cover film is not necessary to be peeled off after the RIE. The polysilicon of the cover film can be used as a part of the semiconductor columnar portion 102.

Then, polysilicon is deposited along the sidewall of the tunnel insulating layer 103 by the CVD method to form the above-described semiconductor columnar portion 102. Further, the insulating film core 101 is deposited on the inner wall of the semiconductor columnar portion 102. This completes the structure of the memory string MS. On the semiconductor substrate SB of the edge seal portion ES, before depositing of the above-described laminated body, the isolation insulating film STI is embedded into the isolation insulating groove, which is formed by digging down the substrate SB. After the memory string MS and the isolation insulating film STI are formed as described above, an interlayer insulating film 200 and a spacer film 201' are formed so as to embed the memory string MS and the isolation insulating film STI.

Figure 12:
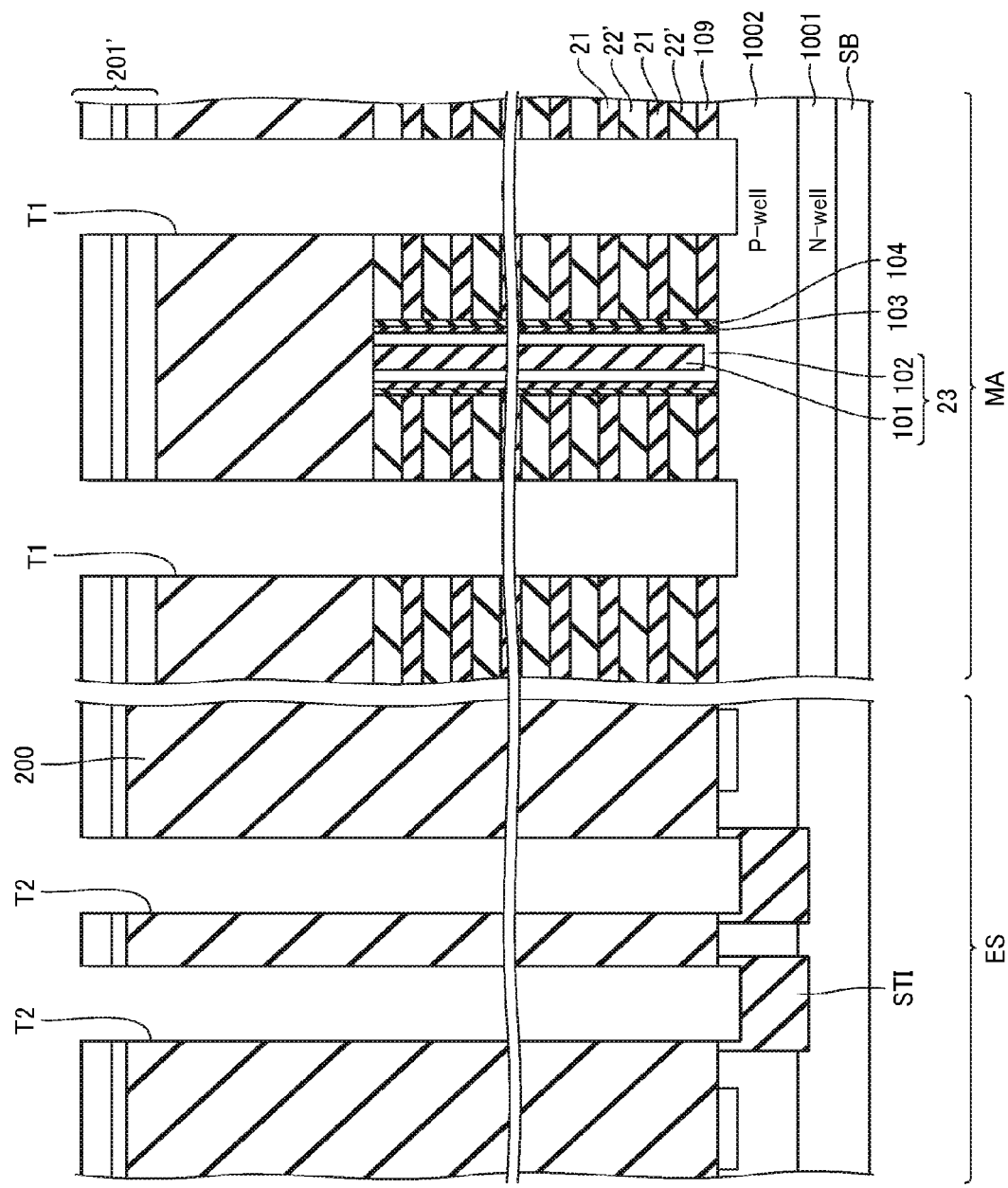

Next, as illustrated in FIG. 12, while a trench T1 is formed to pass through this laminated body to reach the P type well 1002 in the memory cell area MA, in the edge seal portion ES, a trench T2 is formed to reach the spacer film 201' and the interlayer insulating film 200. This trench T1 includes the above-described source contact LI. The trench T2 includes the guard ring GR. The trench T2 is formed into a closed loop shape to surround the memory cell area MA. The trench T2 has the width that is larger in the Y direction than in the X direction. However, the maximum width of the trench T2 is formed smaller than the maximum width of the trench T1.

Figure 13:
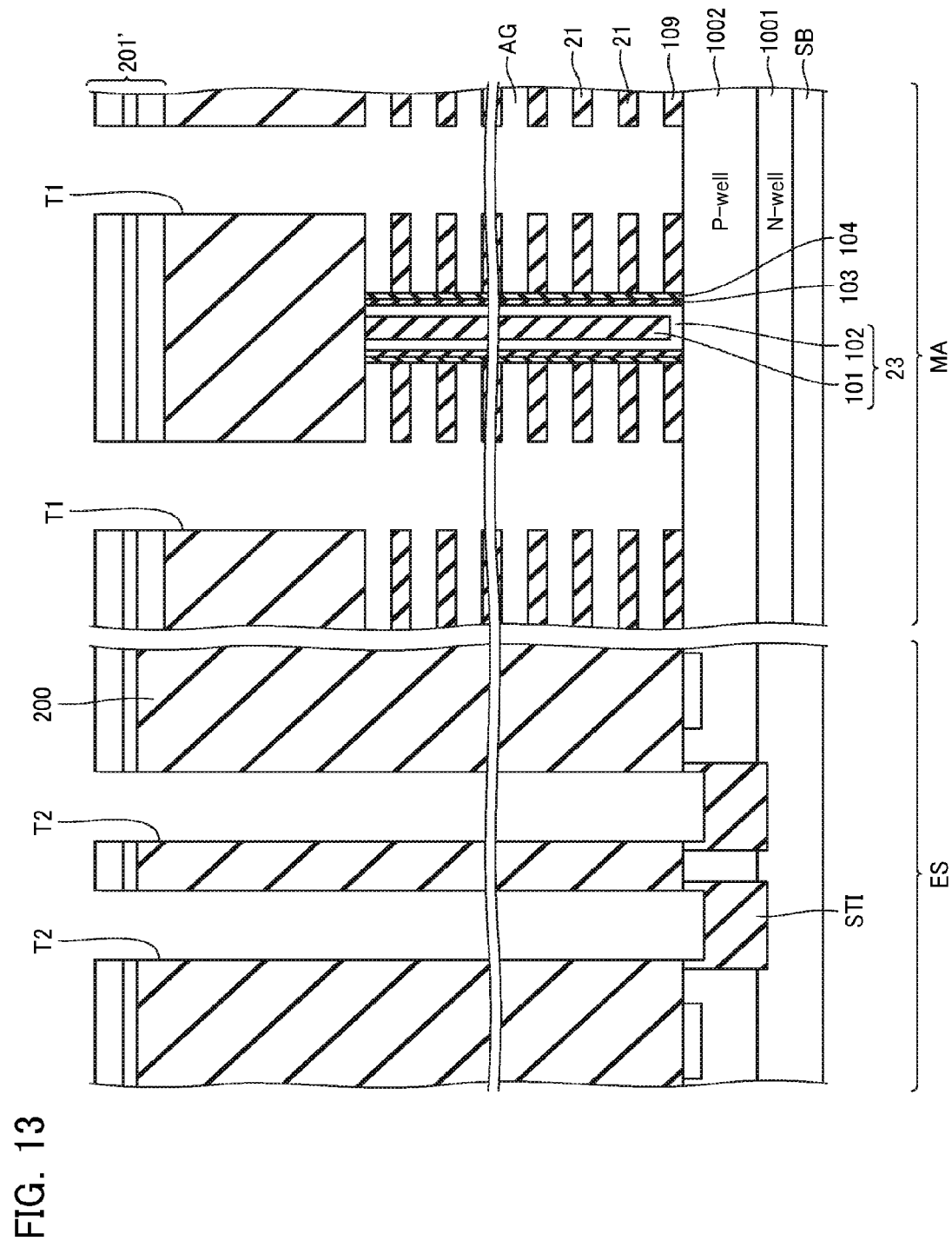
Figure 14:
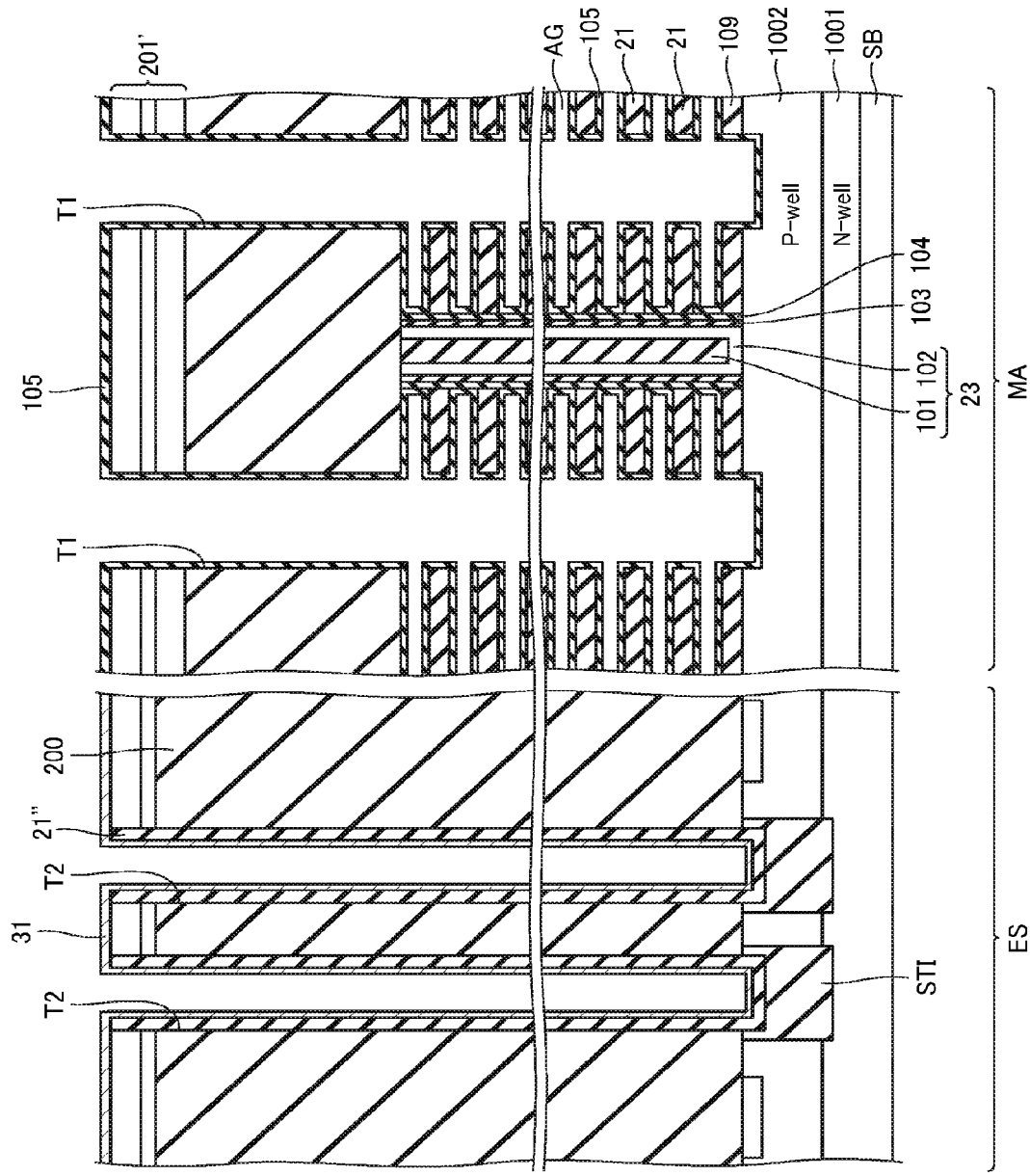
Figure 15:
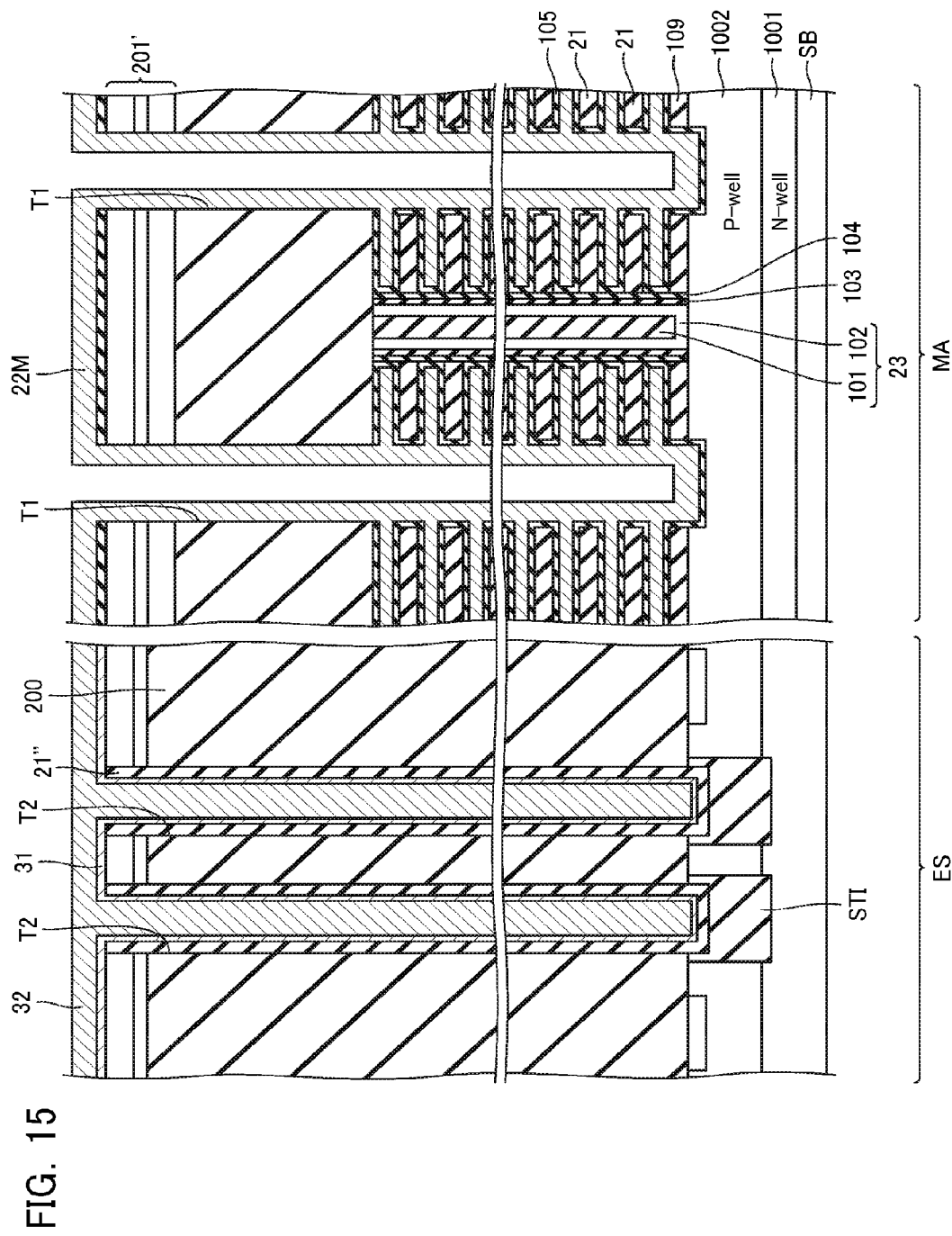

Subsequently, as illustrated in FIG. 13, the sacrificial film 22' of the laminated body is removed by wet etching using a hot phosphoric acid solution and similar solution via the trench T1. Then, as illustrated in FIG. 14, the CVD method is performed to an air gap AG generated by the etching of the sacrificial film 22' to form the above-described block insulating layer 105 along the sidewall of the air gap AG. Further, as illustrated in FIG. 15, the conducting film such as tungsten is deposited further to form a conducting layer 22M. This conducting film 22M is a film that is to be the above-described conducting layers 22 and 32. At this time, while the trench T2 in the edge seal portion ES is filled with the conducting film 22M, the trench T1 in the memory cell area MA leaves the air gap internally without filled with the conducting film 22M completely.

Figure 16:
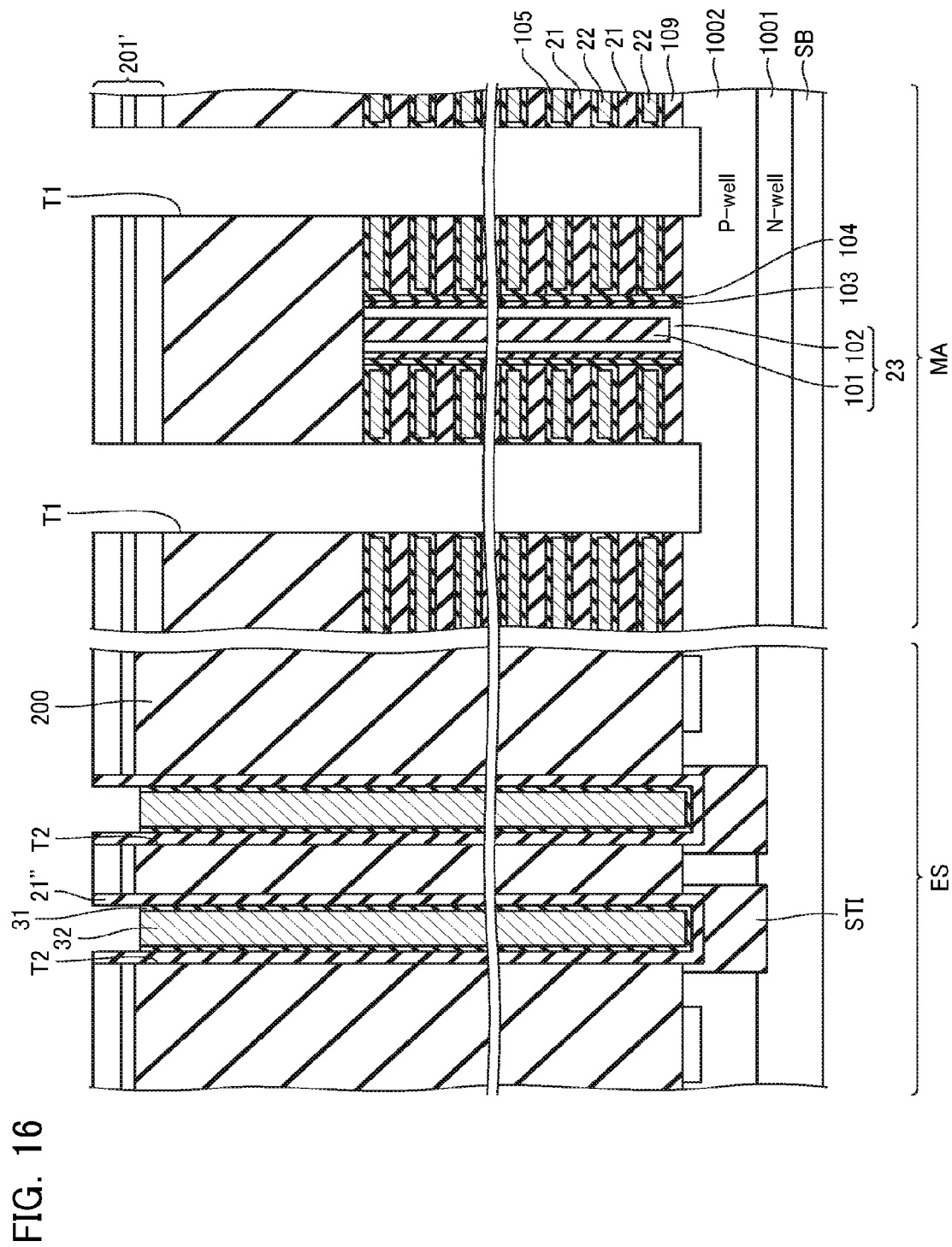
Figure 17:
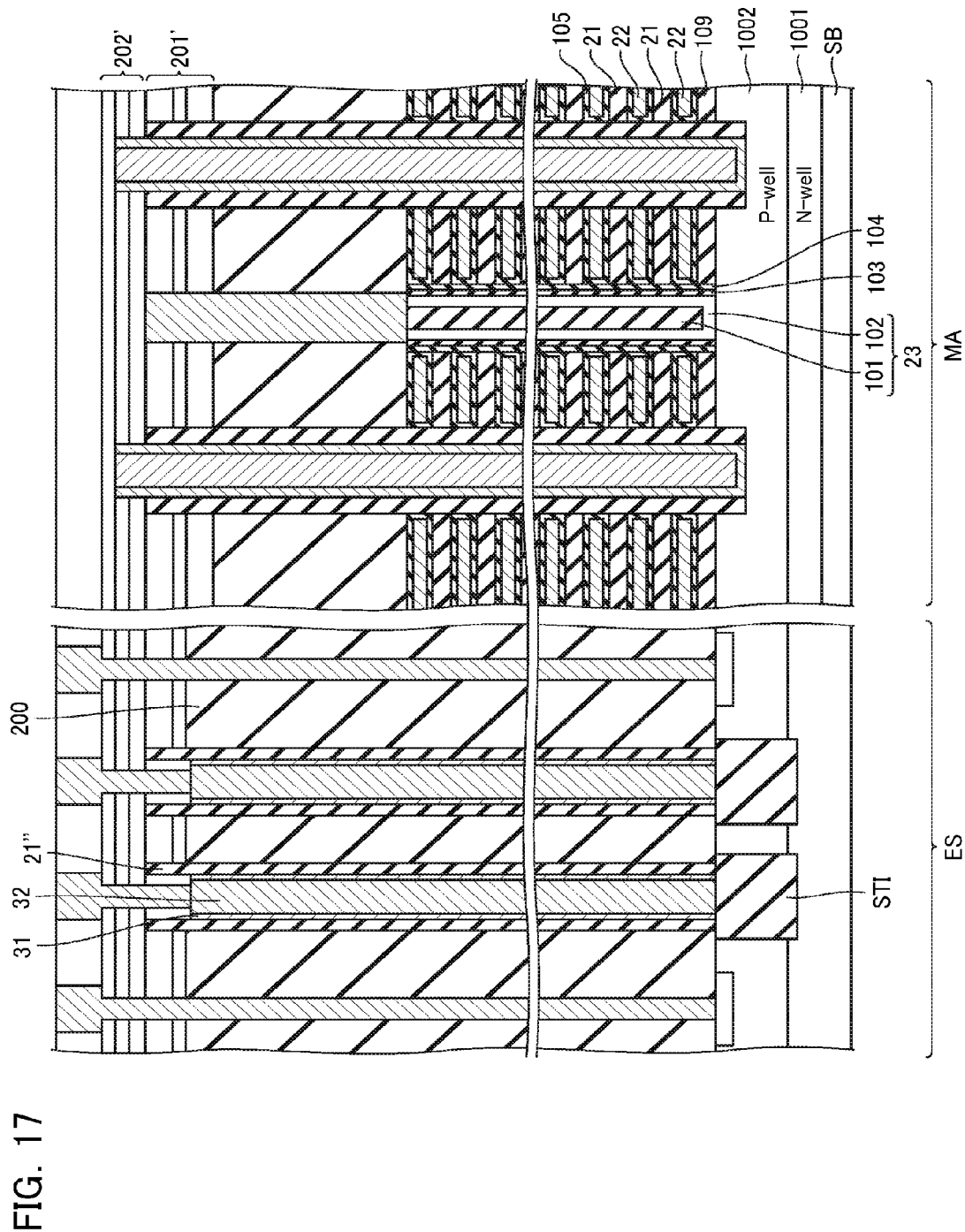

Subsequently, as illustrated in FIG. 16, the excess conducting layer 22M, which is deposited outside the trenches T1 and T2, and the excess conducting layer 22M, which is formed within the trench T1, are removed by wet etching using, for example, the hot phosphoric acid solution. This separates the conducting layer 22M of the memory cell area MA in the vertical direction to form the above-described conducting layers 22. On the other hand, the conducting film 22M formed in the trench T2 is removed only the part near the upper end of the trench T2. The conducting layer 22M left in the trench T2 forms the above-described conducting layer 32. This forms the structure of the above-described guard ring GR. Subsequently, as illustrated in FIG. 17, the interlayer insulating film and the wiring layer are laminated further on the top surface of the structure in FIG. 16 to complete the device according to the first embodiment.

Second Embodiment

Next, a description will be given of a non-volatile semiconductor memory device according to a second embodiment with reference to FIG. 18. This non-volatile semiconductor memory device according to the second embodiment differs from the first embodiment in the configuration of the edge seal portion ES. The other configurations, for example, the configuration of the memory cell area MA are similar to those of the first embodiment. Therefore, the overlapped description will not be further elaborated here.

Figure 18:
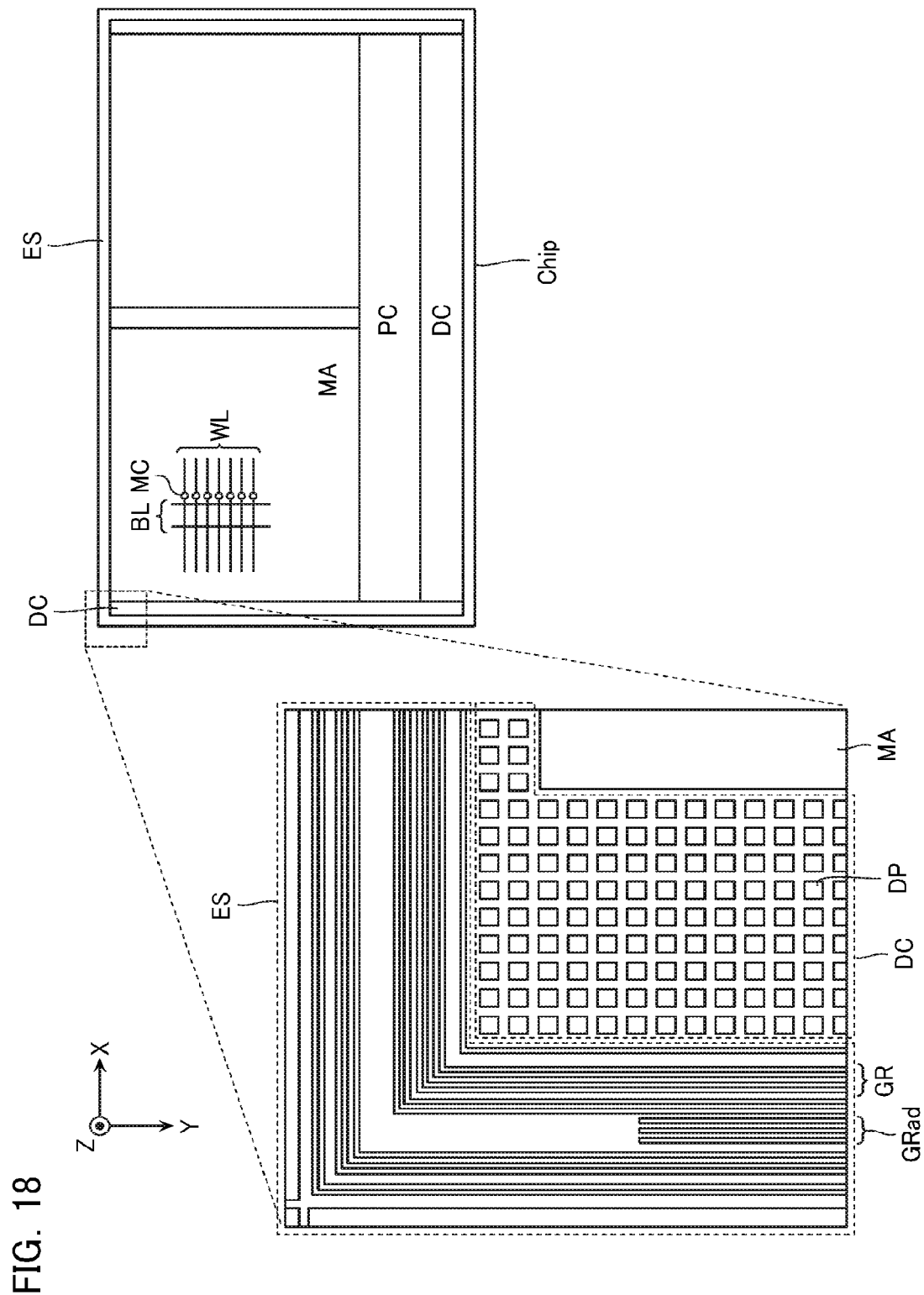
FIG. 18 is a plan view illustrating the structure of a non-volatile semiconductor memory device of a second embodiment.

FIG. 18 is a plan view illustrating the configuration of the edge seal portion ES of the non-volatile semiconductor memory device according to the second embodiment. In FIG. 18, like reference numerals in FIG. 2 designate identical elements to the elements in FIG. 2.

In an edge seal portion ER of the first embodiment, the width of single guard ring GR is different between the X direction (the first part GRx) and the Y direction (the second part GRy) (W2>W1). In contrast to this, in the second embodiment, the single guard ring GR can be formed so as to the width in the X direction and the width in the Y direction is identical. However, in addition to having the guard ring GR, the edge seal portion ER includes an additional guard ring GRad with the longitudinal direction in the Y direction. The width of a guard ring GRad may be identical to, or may be different from the width of the original guard ring GR. This guard ring GRad has only a part extending with the longitudinal direction in the Y direction, and does not have the component extending in the X direction. According to the second embodiment, in the guard ring GRad, the internal stress in the Y direction along the longitudinal direction acts as the counter of the internal stress in the X direction of the conducting layer 22. This reduces the difference of the warping of the substrate SB between the X direction and the Y direction.

Third Embodiment

Next, a description will be given of a non-volatile semiconductor memory device according to a third embodiment with reference to FIG. 19. This non-volatile semiconductor memory device according to the third embodiment differs from the first embodiment in the configuration of the edge seal portion ES. The other configurations, for example, the configuration of the memory cell area MA are similar to those of the first embodiment. Therefore, the overlapped description will not be further elaborated here.

Figure 19:
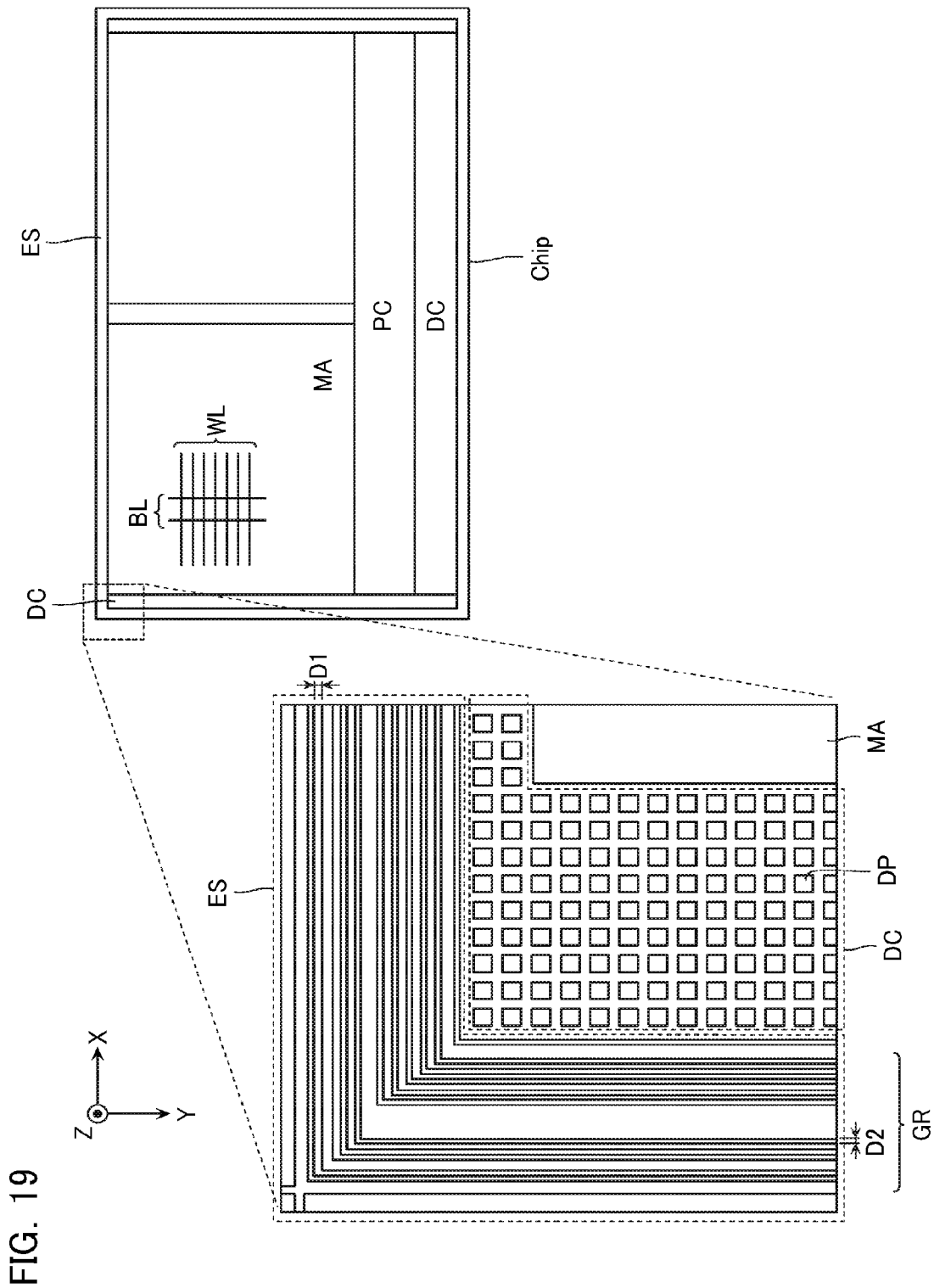
FIG. 19 is a plan view illustrating the structure of a non-volatile semiconductor memory device of a third embodiment.

FIG. 19 is a plan view illustrating the configuration of the edge seal portion ES of the non-volatile semiconductor memory device according to the third embodiment. In FIG. 19, like reference numerals in FIG. 2 designate identical elements to the elements in FIG. 2.

In the guard ring GR of the third embodiment, similar to the second embodiment, the widths W in the X direction and in the Y direction can be identical. However, while the arrangement interval of the multiple guard rings GR in the X direction is a distance D1 (the average value), the arrangement interval of the multiple guard rings GR in the Y direction is a distance D2 (D2<D1). This causes the arrangement density of the guard ring GR to be different between the part with the longitudinal direction in the X direction (first part) and the part with the longitudinal direction in the Y direction (second part). The difference of the arrangement density of the guard rings GR makes the structure of the guard ring GR different between the first part and the second part. This provides effects similar to the above-described embodiments.

Fourth Embodiment

Next, a description will be given of a non-volatile semiconductor memory device according to a fourth embodiment with reference to FIG. 20. This non-volatile semiconductor memory device according to the fourth embodiment differs from the first to the third embodiments in the configuration of the edge seal portion. The other configurations, for example, the configuration of the memory cell area MA are similar to those of the first embodiment. Therefore, the overlapped description will not be further elaborated here.

Figure 20:
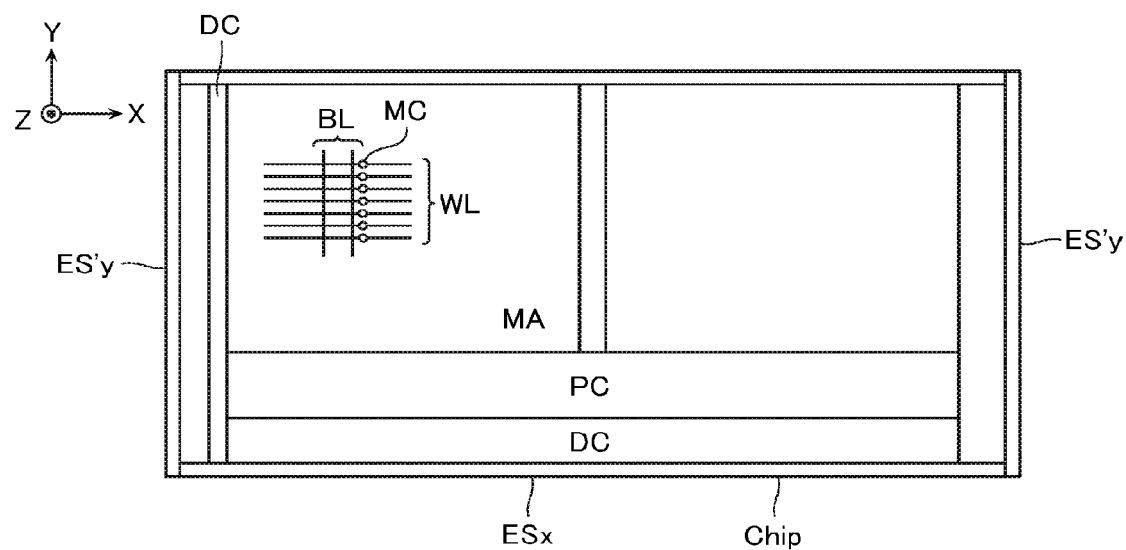
FIG. 20 is a plan view illustrating the structure of a non-volatile semiconductor memory device of a fourth embodiment.

FIG. 20 is a plan view illustrating the configuration of the edge seal portion of the non-volatile semiconductor memory device according to the fourth embodiment. In FIG. 20, like reference numerals in FIG. 2 designate identical elements to the elements in FIG. 2.

The non-volatile semiconductor memory device of the fourth embodiment includes an edge seal portion ESx extending in the X direction and an edge seal portion ES'y as the edge seal portion. Then, the two edge seal portions ESx and ES'y are constituted of different material from one another. The edge seal portion ESx is constituted of the material having the internal stress with an opposite sign to the internal stress of the material constituting the word line WL (the conducting layer 22). The edge seal portion ES'y is constituted of the material having the internal stress with an identical sign to the internal stress of the material constituting the word line WL (the conducting layer 22). The edge seal portion ES'y may be constituted of the identical material to the conducting layer 22.

Both the conducting layer 22 and the edge seal portion ES'y can be formed of, for example, tungsten as the material. However, the conducting layer 22 and the edge seal portion ES'y are not necessary to be formed of the identical material. The conducting layer 22 and the edge seal portion ES'y may be constituted of the different material with the stress in the identical sign. For example, the edge seal portion ES'y can be constituted of silicon nitride (SiN) or silicon carbide (SiC). These materials are, similar to tungsten, the material that provides tensile stress.

On the other hand, the edge seal portion ESx can be constituted of the material that provides compressive stress with the opposite sign, unlike tungsten that provides the tensile stress. For example, the edge seal portion ESx can be constituted of titanium nitride (TiN) nitrided from titanium (Ti) and titanium nitride (TiN) formed by PVD. Or, titanium nitride aluminum (TiAlN) can provide the compressive stress by adjusting the content rate of aluminum as necessary.

Thus, the edge seal portion ES'y is constituted of the material that provides the internal stress (tensile stress) with the identical sign. This provides effects similar to the above-described embodiments. Further, using the material that provides the compressive stress as the edge seal portion ES'y reduces the tensile stress in the X direction. This ensures further reduction of the warping of the substrate SB.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above-described embodiments, the edge seal portion ES includes the guard ring GR for the moisture absorption prevention, and this guard ring GR also functions to reduce the warping of the substrate. However, a peripheral layer for reducing the above-described warping of the substrate may be disposed additionally other than the guard ring GR for the moisture absorption prevention. Instead of disposing the peripheral layer of the embodiment in the edge seal portion, the peripheral layer may be formed in the dicing region where the dicing line is formed. The dicing region is disposed on the peripheral area of the memory cell array. Then, even if the peripheral layer is disposed in the dicing region, similar effects can be provided.

What is claimed is:

1. A semiconductor device comprising:
an element region disposed on a substrate, semiconductor elements being collocated in the element region; and
a peripheral region disposed on the substrate, the peripheral region surrounding the element region, wherein
the element region extends in a first direction parallel to the substrate and includes a plurality of wiring layers laminated on the substrate,
the peripheral region includes a peripheral layer arranged to surround the element region,
the peripheral layer includes a first part extending in the first direction and a second part extending in a second direction intersecting the first direction,
the first part and the second part have mutually different cross-section structures,
the first part is constituted of a second material having an internal stress with an opposite sign to an internal stress of a first material constituting the wiring layer, and
the second part is constituted of a third material having an internal stress with an identical sign to the internal stress of the first material.

2. The semiconductor device according to claim 1, wherein
the second part has a larger cross-sectional area in the cross-section structure than the first part.

3. The semiconductor device according to claim 1, wherein
the second part has a higher arrangement density than the first part.

4. The semiconductor device according to claim 1, wherein
the third material is a material identical to the first material.

5. The semiconductor device according to claim 1, wherein
the second material is titanium nitride (TiN) or titanium nitride aluminum (TiAlN).

6. The semiconductor device according to claim 5, wherein
the first material and the third material are tungsten.

7. The semiconductor device according to claim 1, wherein
the plurality of wiring layers are collocated on the substrate with interlayer insulating films therebetween.

8. The semiconductor device according to claim 7, wherein
the second part has a larger cross-sectional area in the cross-section structure than the first part.

9. The semiconductor device according to claim 7, wherein
the second part has a higher arrangement density than the first part.

10. The semiconductor device according to claim 7, further comprising:
a memory layer disposed on a side surface of the plurality of wiring layers and the interlayer insulating films, and
a semiconductor layer facing to the plurality of wiring layers across the memory layer.

11. The semiconductor device according to claim 1, further comprising:
an isolation insulating film disposed on the substrate, wherein
the peripheral layer has a lower end in contact with the isolation insulating film.

12. The semiconductor device according to claim 1, wherein
the peripheral layer is a guard ring for preventing water from invading from outside.

13. The semiconductor device according to claim 1, wherein
the peripheral layer is disposed in a dicing region for dicing memory chips.

\* \* \* \* \*